(12) United States Patent
Wilder et al.

(10) Patent No.: US 11,145,977 B2
(45) Date of Patent: Oct. 12, 2021

(54) INTERLOCKING MODULAR BEAMFORMER

(71) Applicant: RAYTHEON COMPANY, Waltham, MA (US)

(72) Inventors: Kevin Wilder, Derry, NH (US); Jonathan E. Nufio-Molina, Methuen, MA (US); Phillip W. Thiessen, Wellesley, MA (US); Thomas V. Sikina, Acton, MA (US); James E. Benedict, Lowell, MA (US); Andrew R. Southworth, Lowell, MA (US); Erika Klek, Tewksbury, MA (US)

(73) Assignee: RAYTHEON COMPANY, Waltham, MA (US)

( * ) Notice: Subject to any disclaimer, the term of this patent is extended or adjusted under 35 U.S.C. 154(b) by 208 days.

(21) Appl. No.: 16/441,837

(22) Filed: Jun. 14, 2019

(65) Prior Publication Data
US 2020/0395651 A1 Dec. 17, 2020

(51) Int. Cl.
| | |
|---|---|
| *H01Q 1/12* | (2006.01) |
| *H01Q 25/00* | (2006.01) |
| *H01Q 21/00* | (2006.01) |
| *H01P 1/04* | (2006.01) |
| *H01Q 3/30* | (2006.01) |
| *H05K 1/02* | (2006.01) |

(52) U.S. Cl.
CPC .............. *H01Q 3/30* (2013.01); *H01P 1/047* (2013.01); *H01Q 1/12* (2013.01); *H01Q 21/0025* (2013.01); *H01Q 21/0075* (2013.01); *H01Q 25/00* (2013.01); *H05K 1/0243* (2013.01)

(58) Field of Classification Search
CPC .. H01Q 3/30; H01Q 3/34; H01Q 3/40; H01Q 21/0025; H01Q 21/0075; H01Q 21/0087; H01Q 21/0093; H01Q 21/24; H01P 1/047; H01P 1/184; H01P 5/028; H01P 9/006; H01R 12/7017; H01R 12/7023; H01R 12/7029; H01R 12/71; H01R 12/72; H01R 12/721; H01R 12/722; H01R 12/725; H01R 12/728; H01R 12/73; H01R 12/732
See application file for complete search history.

(56) References Cited

U.S. PATENT DOCUMENTS

| | | |
|---|---|---|
| 7,492,325 B1 | 2/2009 | Moosbrugger et al. |
| 2005/0168301 A1 | 8/2005 | Carson |
| 2015/0200434 A1 | 7/2015 | Wang et al. |
| 2019/0148828 A1 | 5/2019 | Sikina et al. |

OTHER PUBLICATIONS

International Search Report and Written Opinion in International Patent Application No. PCT/US2020/036346 dated Sep. 16, 2020.
Wei-Yang Chen et al: "A Compact Two-Dimensional Phased Array Using Grounded Coplanar-Waveguides Butler Matrices," IEEE-Radar Conference (EURAD) (2012) pp. 421-424.

*Primary Examiner* — Robert Karacsony
(74) *Attorney, Agent, or Firm* — Lando & Anastasi, LLP (57) ABSTRACT

An array includes a support structure configured to support columns of beamformer assemblies, and a plurality of beamformer assemblies supported by the support structure. Each beamformer assembly includes at least one beamformer having at least one first beamformer segment and at least one second beamformer segment configured to interconnect with the first beamformer segment.

16 Claims, 10 Drawing Sheets

| 0.040" Layer | Board A | Board A | Board B | ● | ● | Board B | Board A |
|---|---|---|---|---|---|---|---|
| | Board A | Board A | Board B | ● | ● | Board B | Board A |
| | Board A | Board A | Board B | ● | ● | Board B | Board A |
| | Board A | Board A | Board B | ● | ● | Board B | Board A |
| | Board A | Board A | Board B | ● | ● | Board B | Board A |
| | Board A | Board A | Board B | ● | ● | Board B | Board A |
| | Board A | Board A | Board B | ● | ● | Board B | Board A |
| | Board A | Board A | Board B | ● | ● | Board B | Board A |

INTERLOCKING MODULAR BEAMFORMER

GOVERNMENT RIGHTS

Not applicable.

BACKGROUND

Beamforming or spatial filtering is a signal processing technique used in sensor arrays for directional signal transmission or reception. This is achieved by combining elements in an antenna array in such a way that signals at particular angles experience constructive interference while others experience destructive interference. Beamforming can be used at both the transmitting and receiving ends in order to achieve spatial selectivity.

Beamforming can be used for radio or sound waves. It has found numerous applications in radar, sonar, seismology, wireless communications, radio astronomy, acoustics and biomedicine. Beamforming is used to detect and estimate the signal of interest at the output of a sensor array by means of optimal (e.g. least-squares) spatial filtering and interference rejection.

Figure 1:
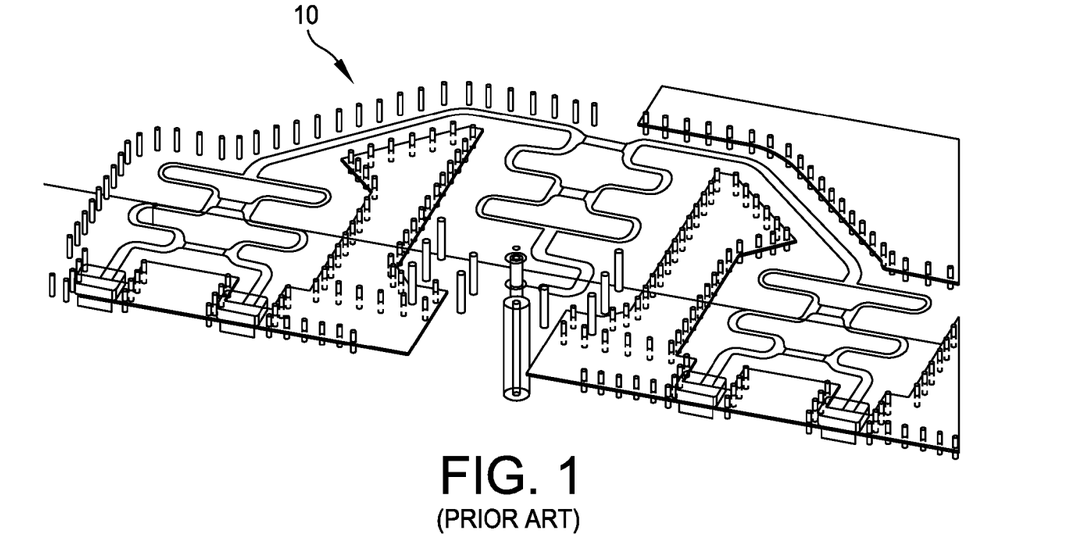
FIG. 1 is a perspective view of a prior art beamformer simulation model.

Contemporary beamformer designs use several technologies responsible for a high-cost and long manufacturing process. Currently, beamformer designs involve a large number of coaxial cables. Specifically, expensive phase-matched radio frequency (RF) cables are used between RF panels and beamformers. Beamformers are designed uniquely for a particular phased array system and cannot fit in than allocated space, due to feature size and substrate thickness limitations. Reference is made to FIG. 1, which shows a conventional beamformer simulation model 10.

Standard printed circuit board (PCB) fabrication processes have hundreds of process steps, extensive manual labor, and slow cycle turnaround. RF cables require routing, connection and inspection. Such cables are time-consuming to assemble and require in-place testing. Conventional PCBs cannot be processed in long lengths and sizes required for the most cost-effective beamformers, since as mentioned such processing involve many steps, significant costs both with manufacturing and materials, and significant cycle time. As assemblies are moved from one process to the next (e.g., lamination, conductive via backfill) labor cost is added to the overall assembly. The added labor cost adds cycle time which leads to long build times which extend any troubleshooting phase. Moreover, existing processes have feature sizes and substrate thickness limits that may preclude compliance with desired thicknesses.

SUMMARY

One aspect of the present disclosure is directed to an array comprising a support structure configured to support columns of beamformer assemblies, and a plurality of beamformer assemblies supported by the support structure. Each beamformer assembly includes at least one beamformer having at least one first beamformer segment and at least one second beamformer segment configured to interconnect with the first beamformer segment.

Embodiments of the array further may include a randomized assortment of beamformers with varying numbers of inputs from 3 to 8. Each beamformer segment of the first beamformer segment and the second beamformer segment may be secured to one another by a conventional RF connector or by a SNAP-RF edge interface. For each beamformer segment of the first beamformer segment and the second beamformer segment, the edge interface may be provided along each side edge of the segment to enable adjacently placed segments to be snap-fit connected to one another. The first beamformer segment may function as a TX line and the second beamformer segment may function as a combiner. Each beamformer further may include terminal segments provided at ends of the beamformer. The at least one beamformer further may include between two and eight ports. Each first beamformer segment may include a first input provided on a side of the segment and a second input provided on an opposite side of the segment. Each second beamformer segment may include a first input provided on a side of the segment and a second input provided on an opposite side of the segment. Each second beamformer segment further may include an output provided on one side of the segment. The at least one beamformer further may include at least one of a vertical launch and a Faraday wall.

Another aspect of the present disclosure is directed to a beamformer comprising at least one first beamformer segment, and at least one second beamformer segment configured to interconnect with the first beamformer segment.

Embodiments of the beamformer further may include one of a 3:1 beamformer, a 5:1 beamformer, and a 8:1 beamformer. Each beamformer segment of the first beamformer segment and the second beamformer segment may be secured to one another by a conventional RF connector or a SNAP-RF edge interface. For each beamformer segment of the first beamformer segment and the second beamformer segment, the edge interface may be provided along each side edge of the segment to enable adjacently placed segments to be snap-fit connected to one another. The first beamformer segment may function as a TX line and the second beamformer segment may function as a combiner. A number of inputs of the beamformer can be expanded between 2 and 8 inputs by attaching additional TX line boards. The beamformer further may include terminal segments provided at ends of the beamformer. Each first beamformer segment may include a first input provided on a side of the segment and a second input provided on an opposite side of the segment. Each second beamformer segment may include a first input provided on a side of the segment and a second input provided on an opposite side of the segment. Each second beamformer segment further may include an output provided on one side of the segment. Each second beamformer segment further may include an output provided on one side of the segment, each second beamformer segment being configured to provide signal crossover to connect adjacent segments to support dual polarization.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. The foregoing features may be more fully understood from the following description of the drawings in which.

DETAILED DESCRIPTION

Antenna elements are often grouped together into a subarray and fed together in a phase-controlled manner to generate the beam characteristics of an antenna larger than that of any single antenna element. A beamformer is a system that performs signal processing with an array of transmitters or receivers. The signals are combined in a manner to increase signal strength to and from a certain direction. A beamformer can include a beam port and a plurality of element ports. In a transmit mode, the signal to be transmitted is applied to the beam port and is distributed by the beamformer to the various element ports. In the receive mode, the unguided electromagnetic signals received by the antenna elements and coupled in guided form to the element ports are combined to produce a beam signal at the beam port of the beamformer.

Column beamformers and interconnectors of embodiments of the present disclosure are contained in a single integrated assembly. Low-cost additive manufacturing techniques or AMT are used to fabricate the beamformer, using snap-together internal radio frequency (RF) connectors, called SNAP-RF, thereby avoiding having to use RF cables. SNAP-RF external connectors are employed prior to assembling the array assembly.

As used herein, AMT refers to manufacturing processes, equipment and materials that are used to produce objects. For example, AMT can include 3D printing processes that are used to produce three-dimensional objects. Other processes can be implemented, such as jetting, fusion, extrusion, deposition and lamination processes. Factors determining which process to pursue include, but are not limited to speed of production, costs, use of material and geometric limitations.

Figure 2:
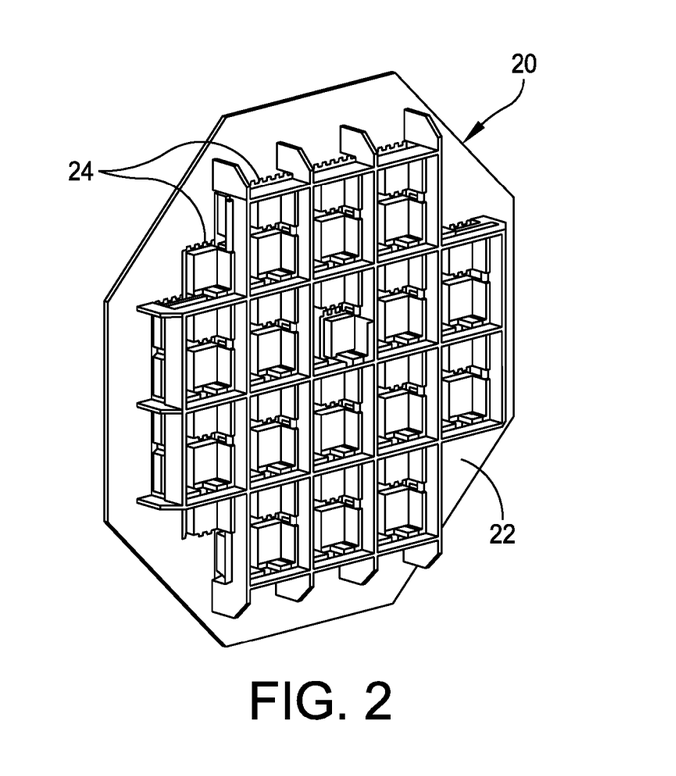
FIG. 2 is a perspective view of an array supporting interlocking modular beamformers of an embodiment of the present disclosure.
Figure 3:
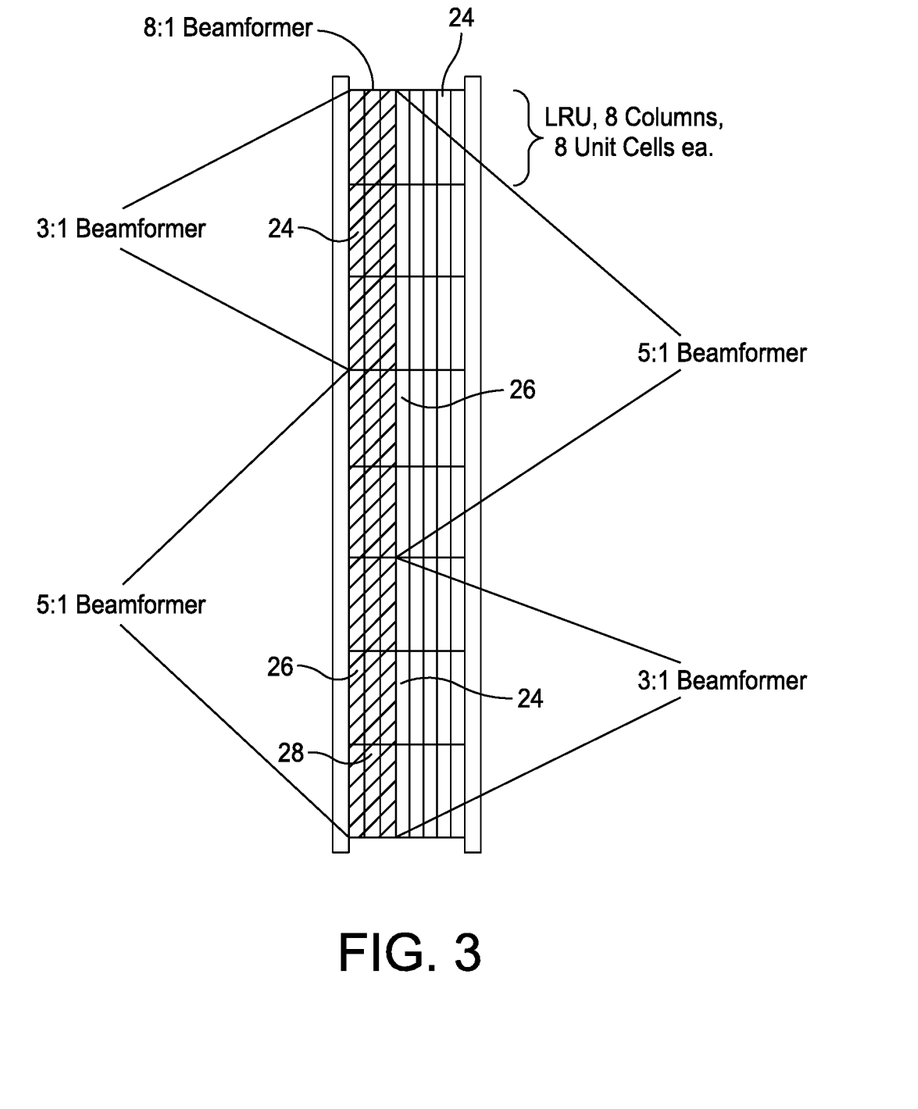
FIG. 3 is an enlarged cross-sectional view of an interlocking modular beamformer shown in FIG. 2.

Referring to FIG. 2, an array of beamformers and interconnections is generally indicated at 20 and configured to be contained in a single integrated assembly. As shown, a vertical array 20 includes a support 22 to contain a plurality of beamformer assemblies, each indicated at 24. FIG. 3 illustrates the beamformer assembly 24 of the array concept shown in FIG. 2 having eight columns each having eight-unit cells. In the shown embodiment, the array concept includes several 3:1 beamformers 24, several 5:1 beamformers 26, and an 8:1 beamformer 28. Low-cost additive manufacturing technology (AMT) beamformers use SNAP-RF internal RF connections that do not require cables and SNAP-RF external connectors that are made prior to assembling the array. AMT offers the advantages of low labor costs, the ability to replace a wet PCB process with a robotic CAD-driven dry process, the ability to employ printed Faraday walls for dry process circuit isolation and SNAP-RF interconnections for automatic, no touch labor, and the ability to employ milled copper transmission lines for high accuracy and conductivity. The results of using AMT processing to create beamformers dramatically reduce use of expensive RF cabling, minimizes labor, and reduces costs and assembly time.

Figure 4:
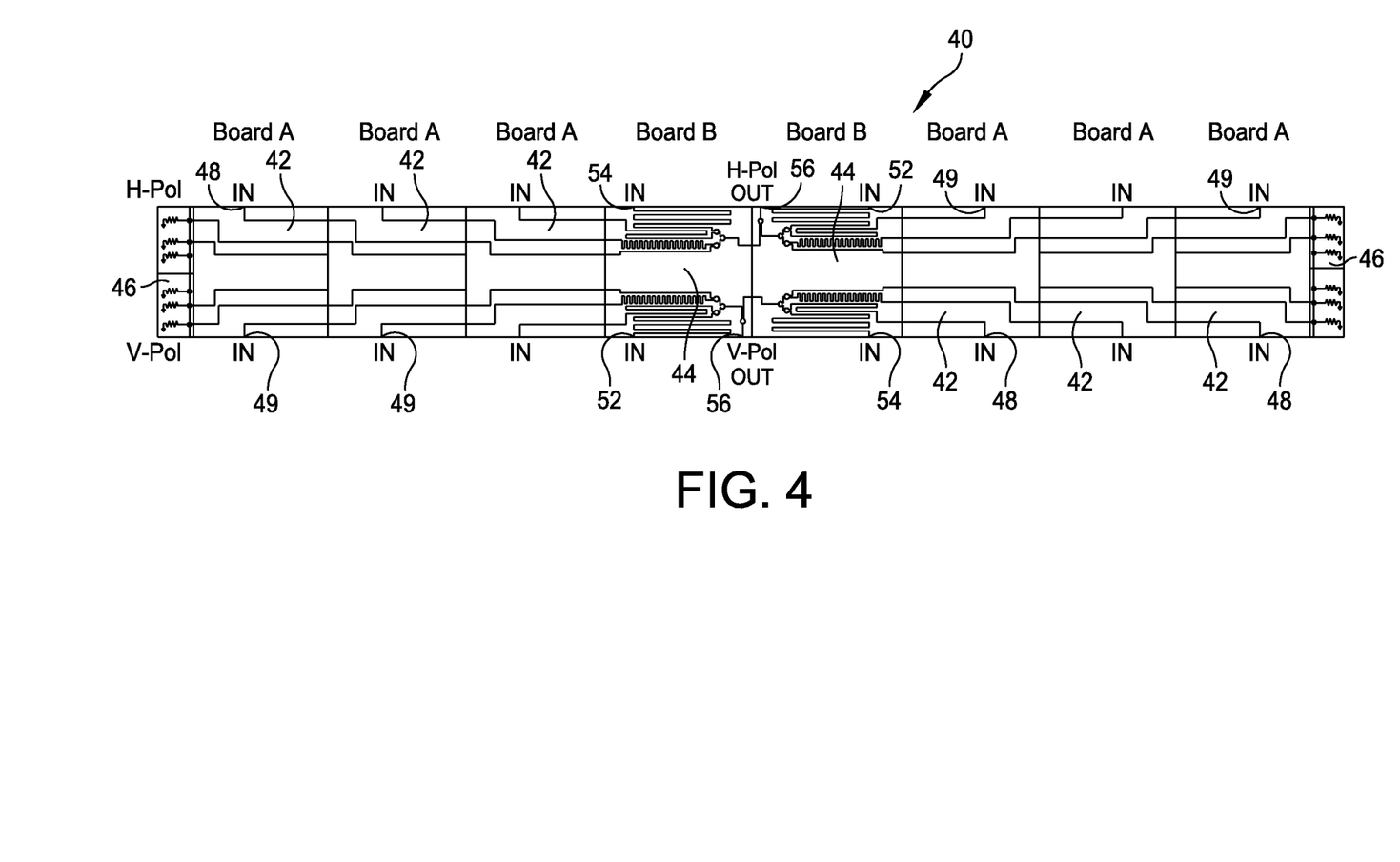
FIG. 4 is an cross-sectional view of an interlocking modular beamformer structure of an embodiment of the present disclosure.
Figure 5:
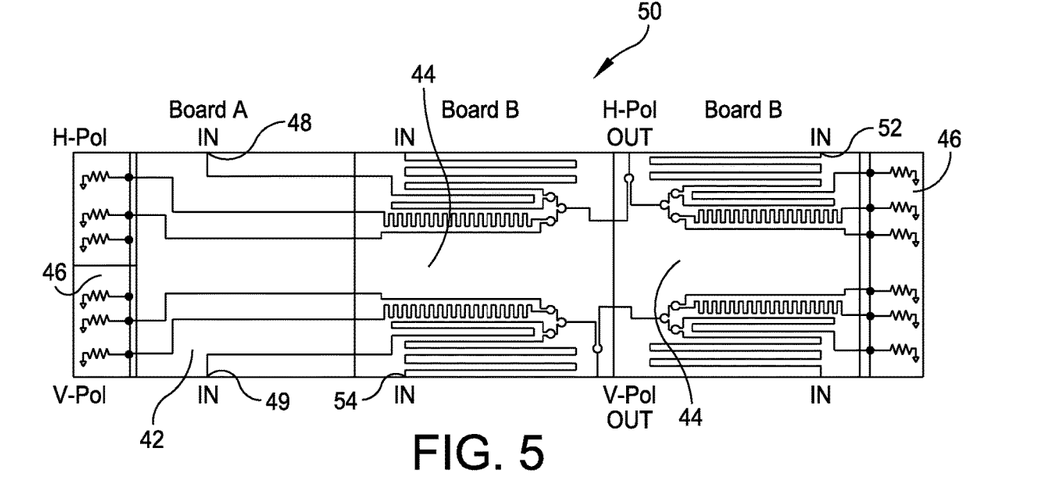
FIG. 5 is an cross-sectional view of an interlocking modular beamformer structure of another embodiment of the present disclosure.

Embodiments of the present disclosure employ a simple modular concept that enables versatility for use in different phased array systems. A small number of individual parts can used to create a beamformer with any number of array ports between two and eight ports. Referring to FIG. 4, a beamformer, generally indicated at 40, includes eight ports. Referring to FIG. 5, a beamformer, generally indicated at 50, includes three ports. The versatile design enables significant cost savings that uses stripline transmission lines and SNAP-RF connectors instead of bulky, phased-match RF cables.

Figure 5A:
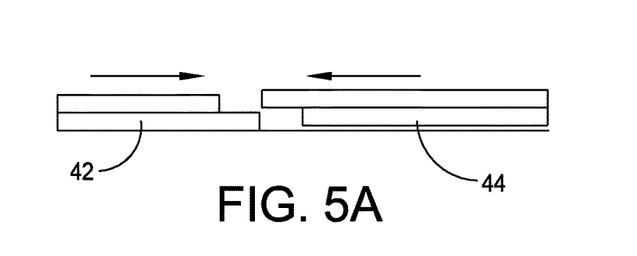
FIG. 5A is a side view showing an edge interface between segments of an interlocking modular beamformer structure.

With the beamformers 40, 50 shown in FIGS. 4 and 5, respectively, each beamformer includes a first beamformer segment 42 and a second beamformer segment 44, with each beamformer segment being secured to one another by a SNAP-RF connector interface. In a certain embodiment, the first beamformer segment 42 functions as a TX line and the second beamformer segment 44 functions as a combiner. Each of the first beamformer segment and the second beamformer segment is provided with an edge interface provided along each side edge of the segment that enables adjacently placed segments to be snap-fit connected to one another without dedicated RF connectors. The circuit elements that create the connection between two adjacent boards are formed as features of each of the PWBs. Specifically, two adjacent boards contain exposed signal traces which are overlapped with each other, allowing electric current to flow between the two boards, and preserving the stripline propagation mode present in the substrate. In one embodiment, the edge interface can include mating step features associated with adjacently positioned surfaces. FIG. 5A illustrates an edge interface provided for segments 42, 44 having an interlocking step features. Each beamformer 40, 50 further includes terminal segments, each indicated at 46, provided at the ends of the beamformer. In one embodiment, the terminal segment is a SNAP terminator.

As shown, each first beamformer segment 42 includes a specified pattern of traces that enable communication between traces of adjacent first beamformer segments, e.g., beamformer segments 42, 44. Each first beamformer segment 42 further includes a first input 48 provided on a side of the segment and a second input 49 provided on an opposite side of the segment. Each second beamformer segment 44 includes a specified pattern of traces that enable communication between traces of the adjacent first beamformer. Each second beamformer segment further includes a first input 52 provided on a side of the segment and a second input 54 provided on an opposite side of the segment. Each second beamformer segment 44 further includes an output 56 provided on the side of the segment having input 52. Since the first and second beamformer segments 42, 44 are each fabricated from an AMT technique, small feature sizes and a low profile is achieved, at a low cost with minimal parts. The assembled beamformers 40, 50 are configured to be assembled in an array vertical support structure, such as the structure shown in FIG. 2.

As mentioned above, the pattern of traces of the first beamformer segment 42 are configured to enable communication when securing the first beamformer segment to another first beamformer segment, as shown with beamformer 40. The pattern of traces of the first beamformer segment are also configured to enable communication when securing the first beamformer segment to the second beamformer segment, as shown with beamformer 40 and beamformer 50. In addition, the second beamformer segment 44 can be configured to include phase matching delay lines and combiner network. The delay lines compensate for varying branch port transmission line lengths. The second beamformer segment 44 further can be configured to be implemented in 25-ohm characteristic impedance lines. With beamformers 40, 50, less that 50-ohm combiners may not possible due to a minimum PCB process linewidth.

Figure 6:
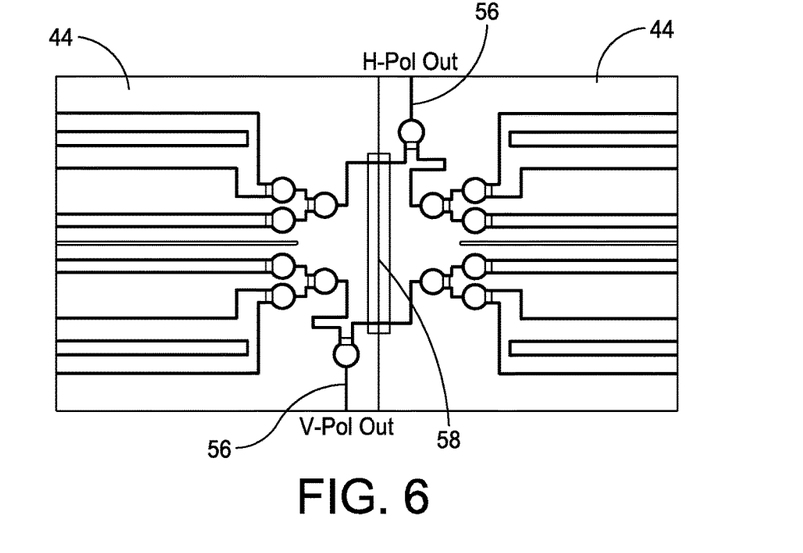
FIG. 6 is an enlarged cross-sectional view of two combiners of an interlocking modular beamformer structure supporting dual polarization.

Referring to FIG. 6, the pattern of traces for the second beamformer segment 44 are illustrated. As shown, adjacently placed second beamformer segments 44 are matched to provide signal crossover at 58, with an output 56 provided on one side of one of the segments 44 and another output 56 provided on an opposite side of the other segment 44. The second beamformer segment 44 each include a signal crossover to connect the adjacent segments. This beamformer design supports dual polarization.

As described, the modular beamformer design uses two RF board designs, i.e., the first beamformer segment 42 and the second beamformer segment 44, and SNAP-RF technology for all signal transmission and combining. The SNAP-RF approach allows for quick and easy assembly and panel replacement and reduces cost. The beamformer design is compatible with automated manufacturing, e.g., the "factory of the future." The unique design allows for continuous RF assembly that spans the height of the array and enables randomized column beamforming.

Using AMT techniques removes most of the costly operations associated with conventional printed circuit board processes. In addition, build time and labor is reduced. Materials and processes associated with the beamformer designs of embodiments of the present disclosure are inexpensive when compared to using RF cabling. AMT techniques enable printed Faraday walls that provide excellent isolation without plated vias. Moreover, SNAP-RF board interconnections eliminate commercial connectors.

The AMT board fabrication process involves the replacement of several traditional PWB fabrication steps with alternative processes aimed at reduction of costs and use of harmful chemicals. A board substrate is first etched and bonded in the traditional fashion. Then vertical layer to layer connections, traditionally plated copper vias, are replaced with copper vertical launch (CVL). CVL is a soldered vertical conductive post connecting signal traces on multiple layers. Ground and isolation vias are replaced with Faraday walls, which are milled channels into the PWB, filled with conductive ink or epoxy. Faraday walls provide trace to trace isolation and control parallel plate modes inside stripline circuits.

Embodiments of the beamformer arrays disclosed herein can be used in a wide range of phased array antennas, and can be used as a component in a phased array system. Reduction in loss between RF panels and DREX is achieved, as well as improving field serviceability. Assemblies embodying the interlocking beamformer disclosed herein are easier to service/replace in the field than comparable systems built with conventional processes.

Figure 7:
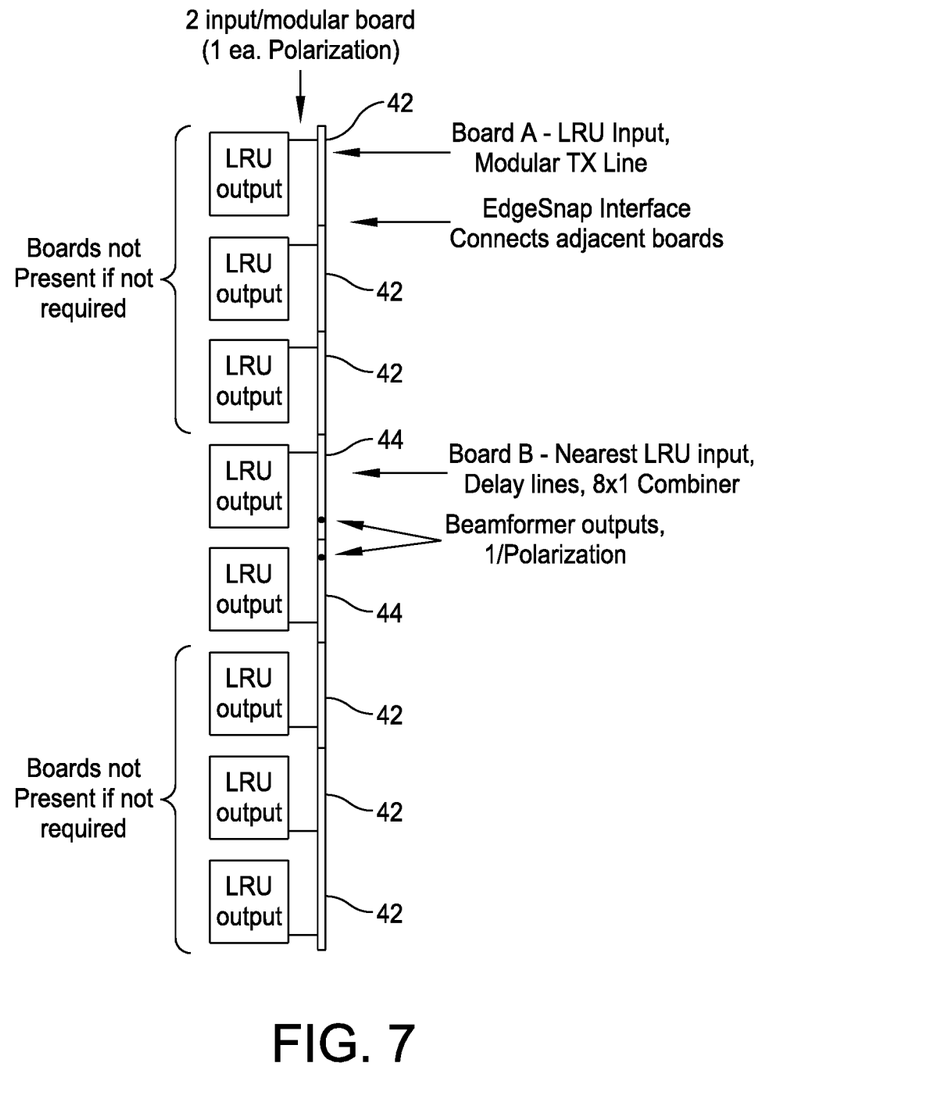
FIG. 7 is a schematic view of an interlocking modular beamformer structure of another embodiment of the present disclosure.

Referring to FIG. 7, the modular beamformer structure of embodiments of the present disclosure employs only two separate RF board designs, i.e., the first beamformer segment 42 and the second beamformer segment 44. As shown, the first beamformer segments 42 embody TX line boards, each having an identical trace pattern. The second beamformer segments 44 embody combiner boards, each having an identical trace pattern. The first beamformer segments can be added to the array to produce beamformers with 2:8 inputs. Unused lines of traces of the first beamformer segments are terminated. Each of the first beamformer segment 42 and the second beamformer segment 44 is provided with an edge interface that enables adjacently placed segments to be snap-fit connected to one another without dedicated RF connectors. In the shown embodiment, a stack of eight beamformer segments (six first beamformer segments and two second beamformer segments) are provided to achieve an LRU column. A total approximate thickness is 0.320 inches for a stack of eight beamformers for dual polarization system.

Figure 8:
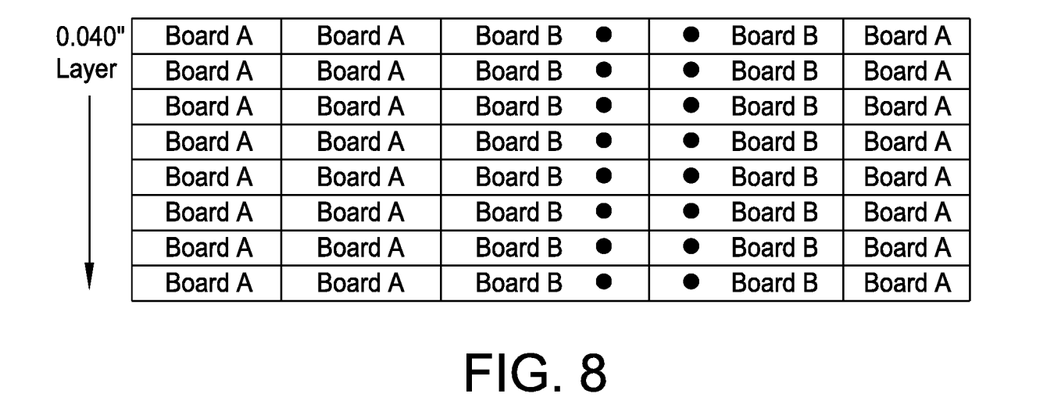
FIG. 8 is a table showing vertical stack-up of an exemplary interlocking modular beamformer structure.

Referring to FIG. 8, a total thickness of each beamformer is 0.40 inches. As shown, no staggered arrangement is required. The edge interface allows beamformers to mount face-to-face. A total of eight beamformers are required per LRU column (eight outputs/LRU/pol). The total beamformer stack-up thickness is approximately 0.320 inches thus achieving a board stack having a very low profile for each LRU column.

Figure 9:
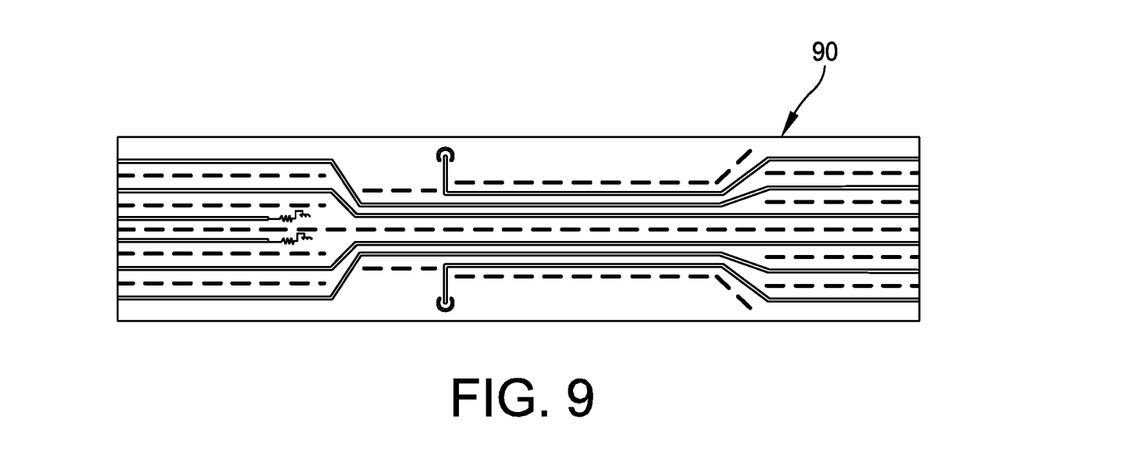
FIG. 9 is a cross-sectional view of a segment of an interlocking modular beamformer structure of another embodiment of the present disclosure.
Figure 10:
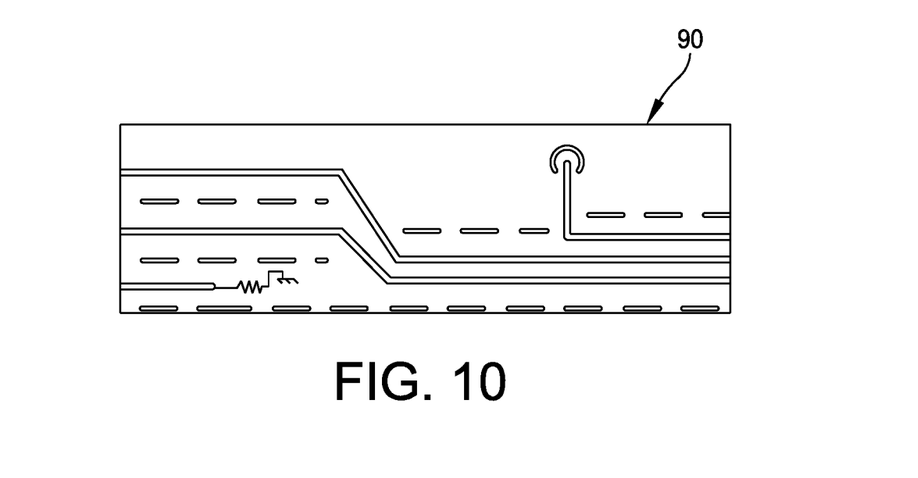
FIG. 10 is an enlarged view of the segment shown in FIG. 9.
Figure 11:
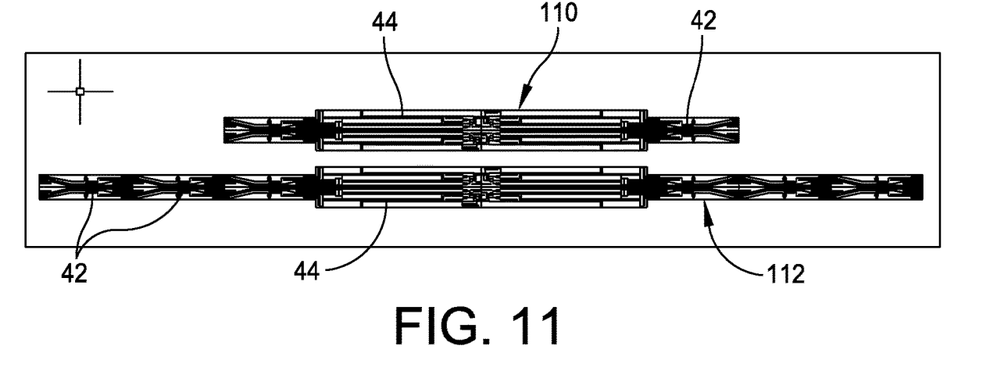
FIGS. 11-14 are views showing two exemplary interlocking modular beamformer structures of embodiments of the present disclosure.
Figure 12:
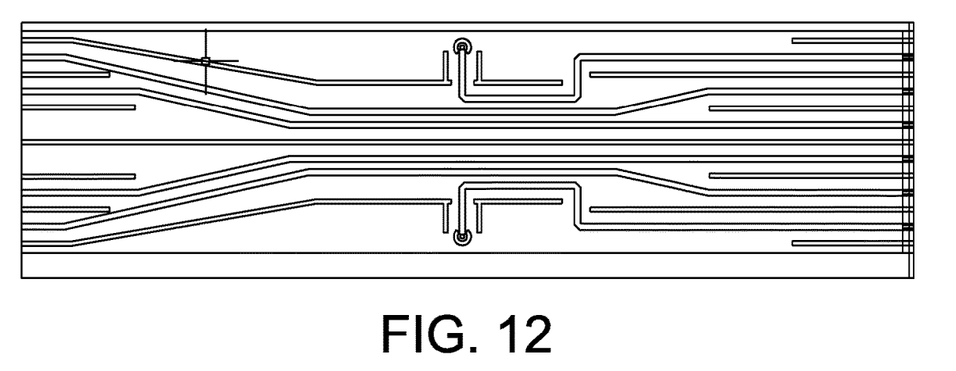
Figure 13:
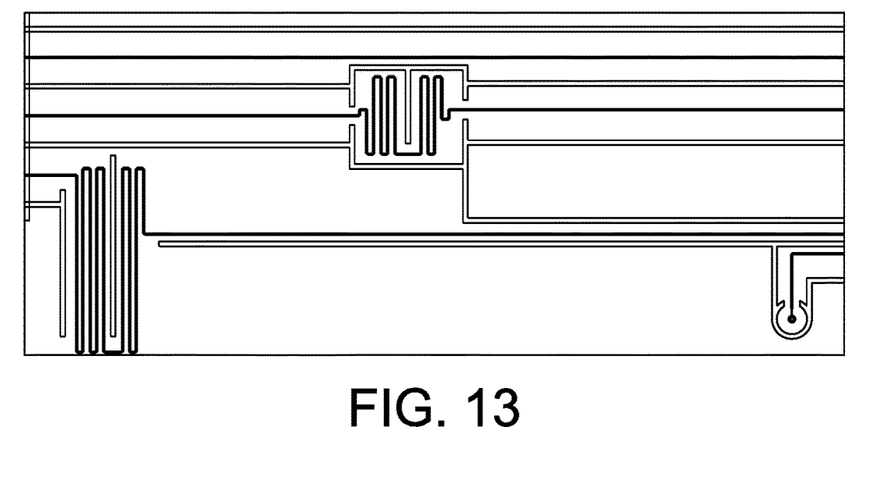
Figure 14:
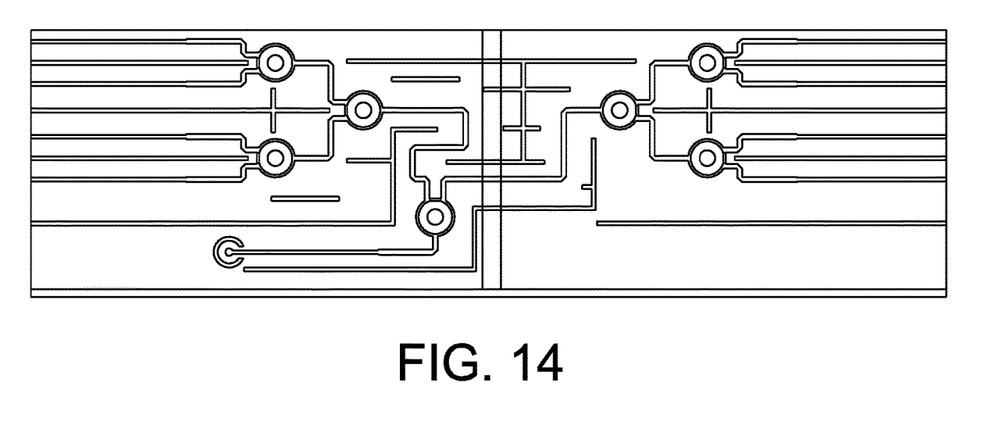

Referring to FIGS. 9 and 10, a modular interlocking beamformer structure is generally indicated at 90. As shown, the beamformer structure 90 includes linewidth spacing at an edge interface to connect with adjacent structures. The linewidth structure includes evenly spaced lines that are configured closer together to enable features, such as vertical launch and Faraday walls to be fabricated. The structure can be configured to achieve a TLY of 30 mil, having 50-ohm transmission line with an approximate 50 mil width. Staggered length between lines avoid correlated reflections on circuits. AMT Faraday walls are used for electrical isolation between transmission lines.

Referring to FIGS. 11-14, a modular interlocking beamformer structure embodying a four-port device is generally indicated at 110 and a modular interlocking beamformer structure embodying an eight-port device is generally indicated at 112. The four-port device 110 includes two first beamformer segments 42 and two second beamformer segments 44. The eight-port device 112 includes six first beamformer segments 42 and two second beamformer segments 44. Delay lines are provided for phase matching.

Figure 15:
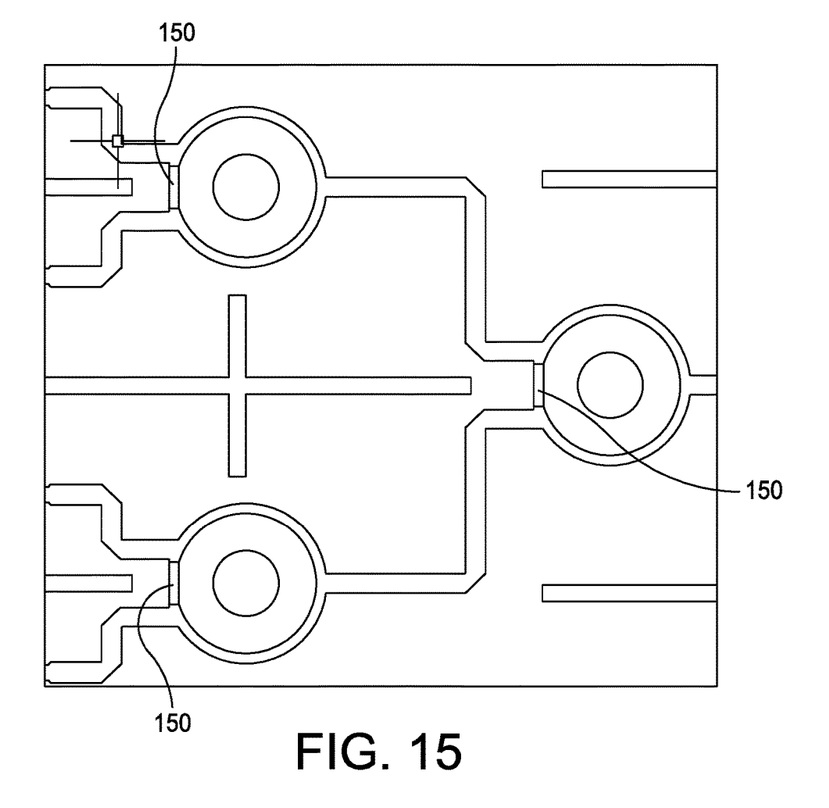
FIGS. 15-18 are views showing design features of an interlocking modular beamformer structure.
Figure 16:
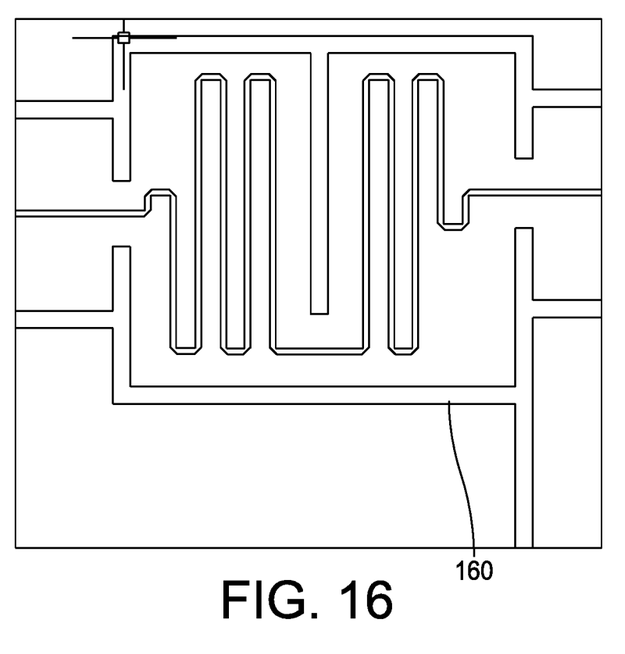
Figure 17:
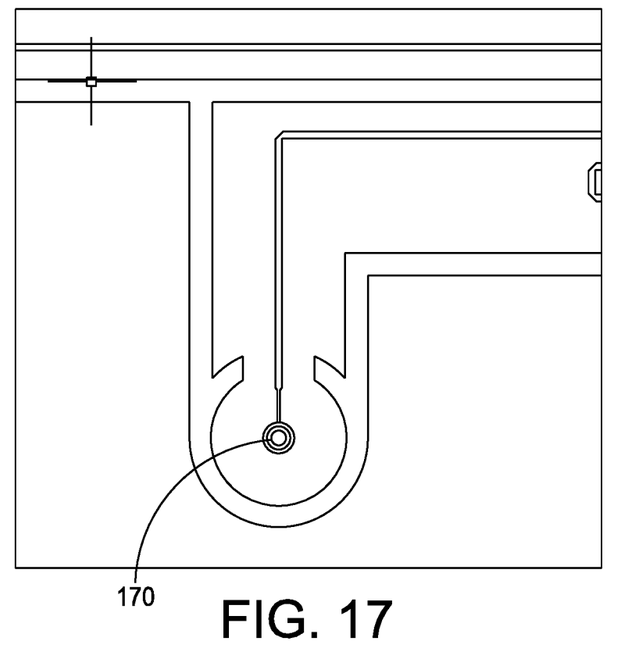
Figure 18:
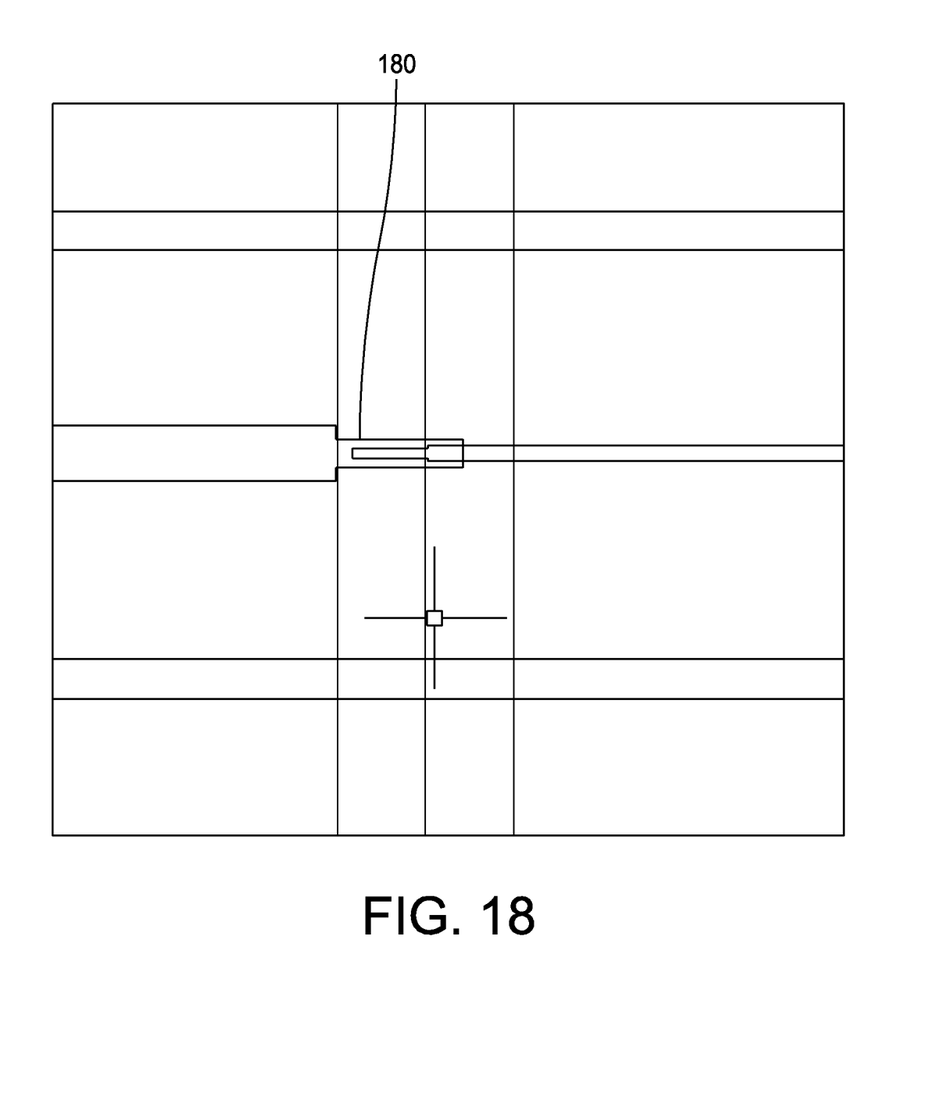

Referring to FIGS. 15-18, interlocking beamformer design features are shown. FIG. 15 illustrates embedded resistors 150. FIG. 16 illustrates Faraday walls 160. FIG. 17 illustrates a CVL 170 that is used for test interface on prototype structures. FIG. 18 illustrates a SNAP-RF connector 180.

The traditional PCB process has successfully introduced changes over the last 15 to 20 years resulting in substantial recurring cost reductions. Major design methods have not changed very much as ground vias are still used to create EMI shielding, plated signal vias are used to connect layers together, and RF PCBs take a significant amount of time to prototype. It can take three to five months from when a prototype is requested from an outside board house to when it arrives ready for test.

Various aspects and embodiments are directed to compact, low profile interconnection systems and methods for electromagnetic circuits, and improved methods of manufacture of the same, that allow for ease of configurability, small sizes, and higher frequencies than conventional systems and methods.

Aspects and examples described provide radio frequency connectors and methods that advantageously apply additive and subtractive manufacturing techniques to provide interlocking modular beamformers configured to convey various signals including radio frequency, direct current (DC), logic signals, or the like.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The term "radio frequency" as used herein is not intended to refer to any particular frequency, range of frequencies, bands, spectrum, etc., unless explicitly stated and/or specifically indicated by context. Similarly, the terms "radio frequency signal" and "electromagnetic signal" are used interchangeably and may refer to a signal of any frequency. It should be appreciated that various embodiments of radio frequency circuits may be designed with dimensions selected and/or nominally manufactured to operate at various frequencies. The selection of appropriate dimensions may be had from general electromagnetic principles and are not presented in detail herein. The methods and apparatuses described herein may support smaller arrangements and dimensions than conventionally known, and may allow or accommodate the manufacture of electromagnetic circuits of smaller dimensions than conventionally known, and thereby may be particularly suitable for radio frequency circuits intended to be operated at higher frequencies than conventional methods.

Further advantages of system and methods described herein may be realized. For example, conventional PCB manufacturing may impose limitations on circuit feature sizes, such as the width of signal traces, in comparison with systems and method described herein, thus limiting the highest frequencies for which conventionally made electromagnetic circuits may be suitable. Further, substrate thicknesses impact characteristic impedance (e.g., due to the distance to ground planes disposed upon opposing surfaces) in relation to width of the traces. Accordingly, wider traces required by conventional PCB processes cause selection of thicker substrates (to maintain a particular characteristic impedance), thus limiting how thin the circuit can be manufactured.

Ground vias conventionally provide electrical connectivity between ground planes (e.g., on opposing surfaces of substrates) and provide some isolation of signals on the traces from other traces that may be nearby. The conventional ground vias are drilled holes of about 8 mil diameter or greater, and are required to be a minimum distance apart to maintain structural integrity of the board. Accordingly, ground vias are leaky structures, exhibiting loss of electromagnetic signal, especially at higher frequencies. As various applications require support for higher frequency signals, the minimum spacing between ground vias act like large openings through which relatively small wavelengths of electromagnetic energy may escape.

By comparison, electromagnetic circuits and methods in accord with aspects and embodiments described herein, which use additive manufacturing techniques, allow for electrically continuous structures to connect ground planes. Accordingly, an electrically continuous structure is provided and disposed vertically through one or more substrates, (e.g., between opposing surfaces of the substrate) to form "Faraday walls" that confine electric fields. In various embodiments, such Faraday walls may electrically couple two or more ground planes. Further in various embodiments, such Faraday walls may confine and isolate electromagnetic fields form neighboring circuit components. In some embodiments, such Faraday walls may enforce a boundary condition to limit electromagnetic signals to be locally transverse electric-magnetic (TEM) fields, e.g., limiting signal propagation to a TEM mode.

In various embodiments, various subtractive (milling, drilling), additive (printing, filling), and adherent (bonding) steps may be carried out, in various orders, with soldering and reflow operations as necessary, to form an electromagnetic circuit having one or any number of substrate layers, which may include one or more interconnect features as described herein.

A generalized method for making any of various electromagnetic circuits includes milling a conductive material disposed on a substrate to form circuit features, printing (or depositing, e.g., via 3-D printing, additive manufacturing techniques) additional circuit features, such as resistors formed of resistive ink, for example. The method may include depositing solder on any feature, as necessary, for example upon the terminal pad 352. The method may also include milling (or drilling) through substrate material (and/or conductive materials) to form openings, such as voids or trenches, and includes depositing or printing (e.g., via 3-D printing, additive manufacturing techniques) conductive material (such as conductive ink or a wire conductor) into the voids/trenches, for example to form Faraday walls or vertical signal launches (e.g., copper). Any of these steps may be done in different orders, repeated, or omitted as necessary for a given circuit design, and may include interconnect structures as described herein. In some embodiments, multiple substrates may be involved in the manufacture of an electromagnetic circuit, and the method includes bonding further substrates as necessary, and further milling and filling operations.

Having described several aspects of at least one embodiment and a method for manufacturing an electromagnetic circuit, the above descriptions may be employed to produce various electromagnetic circuits with an overall thickness of 10 mils (0.010 inches, 254 microns) or less, and may include signal traces, such as the traces as narrow as 4.4 mils (111.8 microns), 2.7 mils (68.6 microns), or even as narrow as 1.97 mills (50 microns), depending upon the tolerances and accuracy of various milling and additive manufacturing equipment used. Accordingly, electromagnetic circuits in accord with those described herein may be suitable for X-Band and higher frequencies, and in some cases up to 70 GHz or more.

Additionally, electromagnetic circuits in accord with those described herein may have a low enough profile (e.g., thickness of 10 mils or less), with accordant light weight, to be suitable for outer space applications, including folding structures to be deployed by unfolding when positioned in outer space.

Further, electromagnetic circuits manufactured in accord with methods described herein accommodate less expensive and faster prototyping, without the necessity for caustic chemicals, masking, etching, electroplating, etc. Simple substrates with pre-plated conductive material disposed on one or both surfaces (sides) may form the core starting material, and all elements of an electromagnetic circuit may be formed by milling (subtractive, drilling), filling (additive, printing of conductive and/or resistive inks), and bonding one or more substrates. Simple solder reflow operations and insertion of simple conductors (e.g., copper wire) are accommodated by methods and systems described herein.

Further, electromagnetic circuits manufactured in accord with methods described herein may accommodate deployment on, or designs calling for, non-planar surfaces. Thin, low-profile electromagnetic circuits, such as described herein and others, may be manufactured using mill, fill, and bond techniques as described herein to produce electromagnetic circuits having any desired contour, to adhere to a surface (such as a vehicle) or to support a complex array structure, for instance.

As disclosed herein, manufacturing is very repeatable and assembly in the field is simplified. AMT techniques reduce loss in stripline compared to coaxial cables. Subarray beamforming methods for randomized simultaneous Rx beams can be produced. Expandable design constructed from interlocking parts. Identical parts used for various input configurations. RF Beamformer circuit comprised of interlocking PWBs. Increased maximum circuit size. Epoxy-, glue- and lamination-free assembly procedure. Elimination of conventional RF connectors from assembly.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. An array comprising:
a support structure configured to support columns of beamformer assemblies; and
a plurality of beamformer assemblies supported by the support structure, each beamformer assembly including at least one beamformer having at least one first beamformer segment and at least one second beamformer segment configured to interconnect with the first beamformer segment,
wherein each beamformer segment of the first beamformer segment and the second beamformer segment is secured to one another by an RF connector or by a SNAP-RF edge interface, and
wherein, for each beamformer segment of the first beamformer segment and the second beamformer segment, the edge interface is provided along each side edge of the segment to enable adjacently placed segments to be snap-fit connected to one another.

2. The array of claim 1, wherein the plurality of beamformer assemblies include a randomized assortment of beamformers with varying numbers of inputs from 3 to 8.

3. The array of claim 1, wherein the first beamformer segment functions as a TX line and the second beamformer segment functions as a combiner.

4. The array of claim 1, wherein each beamformer further includes terminal segments provided at ends of the beamformer.

5. The array of claim 1, wherein the at least one beamformer further includes between two and eight ports.

6. The array of claim 5, wherein each first beamformer segment includes a first input provided on a side of the segment and a second input provided on an opposite side of the segment.

7. The array of claim 6, wherein each second beamformer segment includes a first input provided on a side of the segment and a second input provided on an opposite side of the segment.

8. The array of claim 7, wherein each second beamformer segment further includes an output provided on one side of the segment.

9. The array of claim 1, wherein the at least one beamformer further includes at least one of a vertical launch and a Faraday wall.

10. A beamformer comprising:
at least one first beamformer segment; and
at least one second beamformer segment configured to interconnect with the first beamformer segment,
wherein each beamformer segment of the first beamformer segment and the second beamformer segment is secured to one another by an RF connector or a SNAP-RF edge interface, and
wherein, for each beamformer segment of the first beamformer segment and the second beamformer segment, the edge interface is provided along each side edge of the segment to enable adjacently placed segments to be snap-fit connected to one another.

11. The beamformer of claim 10, wherein the beamformer includes one of a 3:1 beamformer, a 5:1 beamformer, and a 8:1 beamformer.

12. The beamformer of claim 10, wherein the first beamformer segment functions as a TX line and the second beamformer segment functions as a combiner.

13. The beamformer of claim 12, wherein a number of inputs of the beamformer can be expanded between 2 and 8 inputs by attaching additional TX line boards.

14. The beamformer of claim 10, further comprising terminal segments provided at ends of the beamformer.

15. The beamformer of claim 10, wherein each first beamformer segment includes a first input provided on a side of the segment and a second input provided on an opposite side of the segment, each second beamformer segment includes a first input provided on a side of the segment and a second input provided on an opposite side of the segment, and each second beamformer segment further includes an output provided on one side of the segment.

16. The beamformer of claim 10, wherein each second beamformer segment further includes an output provided on one side of the segment, each second beamformer segment being configured to provide signal crossover to connect adjacent segments to support dual polarization.

* * * * *